United States Patent [19]

Iwakiri

[11] Patent Number: 5,361,236
[45] Date of Patent: Nov. 1, 1994

[54] SERIAL ACCESS MEMORY

[75] Inventor: Itsuro Iwakiri, Miyazaki, Japan

[73] Assignee: Oki Electric Industry Co., Ltd., Tokyo, Japan

[21] Appl. No.: 985,595

[22] Filed: Dec. 3, 1992

[30] Foreign Application Priority Data

Dec. 19, 1991 [JP] Japan .................................. 3-336441

[51] Int. Cl.$^5$ .............................................. G11C 7/00
[52] U.S. Cl. .................................... 365/221; 365/206; 365/189.05
[58] Field of Search .................... 365/221, 206, 189.05

[56] References Cited

U.S. PATENT DOCUMENTS

| 4,817,054 | 3/1989 | Banerjee | 365/189 |
| 4,855,957 | 8/1989 | Nogami | 365/230.03 |
| 5,148,399 | 9/1992 | Cho | 365/205 |
| 5,170,374 | 12/1992 | Shimohigashi | 365/189.01 |
| 5,227,697 | 7/1993 | Sakagami | 365/203 |

FOREIGN PATENT DOCUMENTS 3-25791  4/1991  Japan .

Primary Examiner—William L. Sikes
Assistant Examiner—Tiep Nguyen
Attorney, Agent, or Firm—Edward Manzo; Ted K. Ringsred

[57] ABSTRACT

A serial access memory includes a pair of bit lines, a plurality of memory cells each coupled to one of the bit lines and a pair of data lines. The serial access memory also includes a sense amplifier drive line, a sense amplifier, data latch circuit, data transfer circuit and a drive capability control circuit. The sense amplifier drive line is coupled to a potential source for supplying a sense amplifier drive signal from the potential source. The sense amplifier is coupled to the bit lines and the sense amplifier drive line for amplifying a difference of electrical potentials appeared on the bit lines in response to the sense amplifier drive signal. The data latch circuit is coupled to the bit lines and the data lines for latching the amplified electrical potentials appeared on the bit lines as data. The data transfer circuit is coupled between the bit lines and the data latch circuit for controlling an electrical connection between the bit lines and the data latch circuit. The drive capability control circuit is coupled between the power potential source and the sense amplifier drive line for controlling an electrical connection between them. The drive capability control circuit controls its drive capability so as to control a sense amplification capability of the sense amplifier.

15 Claims, 2 Drawing Sheets

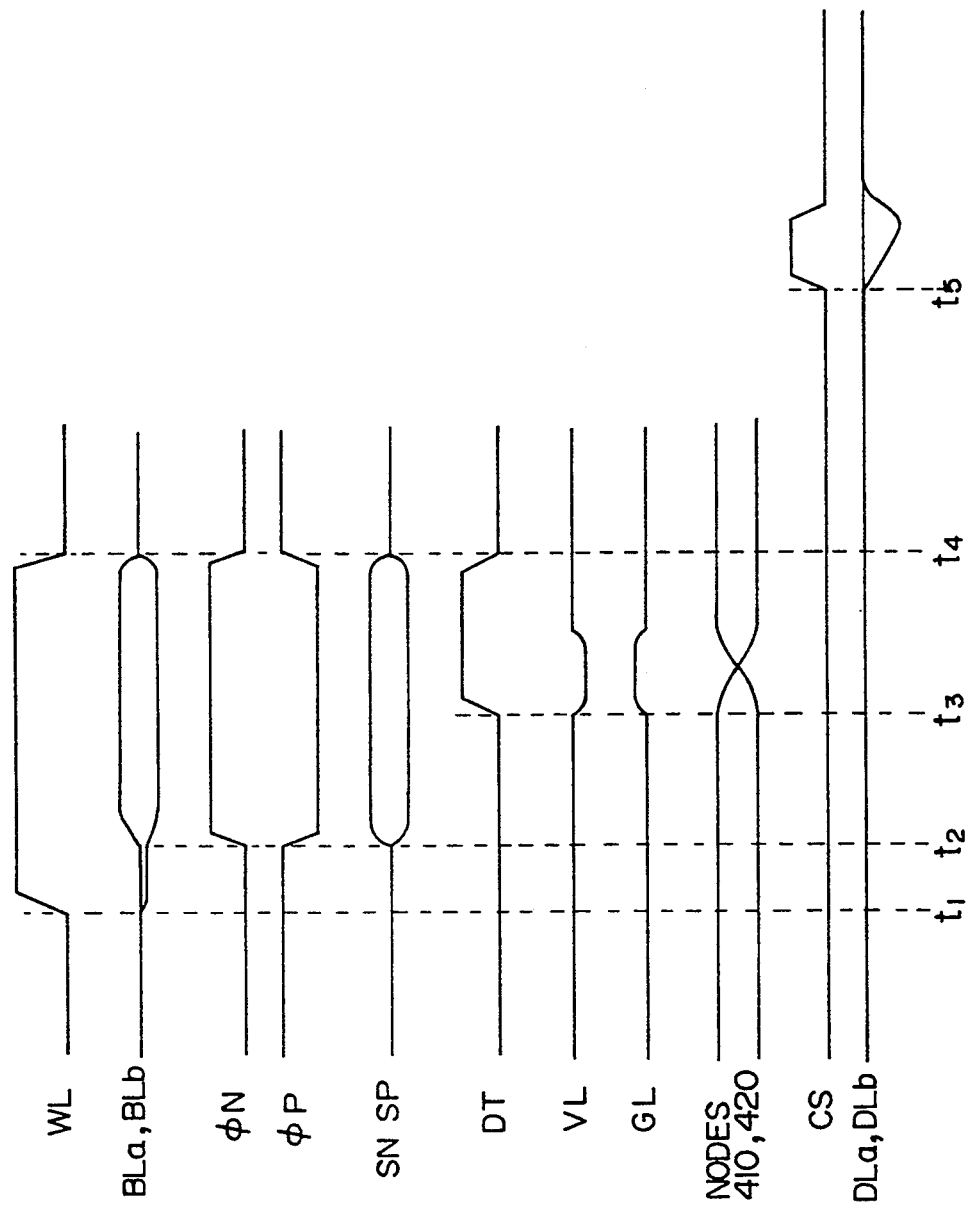

SERIAL ACCESS MEMORY

CROSS REFERENCE TO RELATED APPLICATION

This application claims the priority of Japanese Application Serial No. 3-336441, filed Dec. 19, 1991, the subject matter of which is incorporated herein by reference.

BACKGROUND OF THE INVENTION

The present invention relates to a serial access memory and, more particularly, a serial access memory (SAM) to be employed in a FIFO (First-In First-Out) memory and a multiport RAM which has DRAM (Dynamic Random Access Memory) cells.

A conventional serial access memory is disclosed, for example, in Japanese Laid-Open Patent Application No. 25791-1991. The disclosed serial access memory includes a drive MOS transistor which has a large gate width. The drive MOS transistor supplies a ground potential (GND) or a power supply potential (VCC) to a sense amplifier. The drive capability of the sense amplifier depends on the gate width of the drive MOS transistor.

In case of the conventional serial access memory, however, noises of a power supply potential and a ground potential during operation of the sense amplifier are large and may cause the circuits other than the sense amplifier to malfunction.

SUMMARY OF THE INVENTION

An object of the present invention is to provide a serial access memory which has less susceptibility to noise of the power supply potential and the ground potential during operation of the sense amplifier. Another object of the present invention is to provide a serial access memory which ensures accurate data transfer.

A serial access memory according to the present invention includes a pair of bit lines, a plurality of memory cells each coupled to one of the bit lines and a pair of data lines. The serial access memory according to the present invention also includes a sense amplifier drive line, a sense amplifier, data latch circuit, data transfer circuit and a drive capability control circuit.

The sense amplifier drive line is coupled to a potential source for supplying a sense amplifier drive signal from the potential source. The sense amplifier is coupled to the bit lines and the sense amplifier drive line for amplifying a difference of electrical potentials appearing on the bit lines in response to the sense amplifier drive signal. The data latch circuit is coupled to the bit lines and the data lines for latching the amplified electrical potentials appearing on the bit lines as data. The data transfer circuit is coupled between the bit lines and the data latch circuit for controlling an electrical connection between the bit lines and the data latch circuit. The drive capability control circuit is coupled between the power potential source and the sense amplifier drive line for controlling an electrical connection between them. The drive capability control circuit controls its drive capability so as to control a sense amplification capability of the sense amplifier.

BRIEF DESCRIPTION OF THE DRAWINGS

These and other features and advantages of the invention will be further understood from the following detailed description of the preferred embodiment with reference to the accompanying drawings in which:

FIG. 2 is a timing chart showing signals appeared on the nodes and lines shown in FIG. 1.

DETAILED DESCRIPTION OF THE PREFERRED EMBODIMENT

Figure 1:
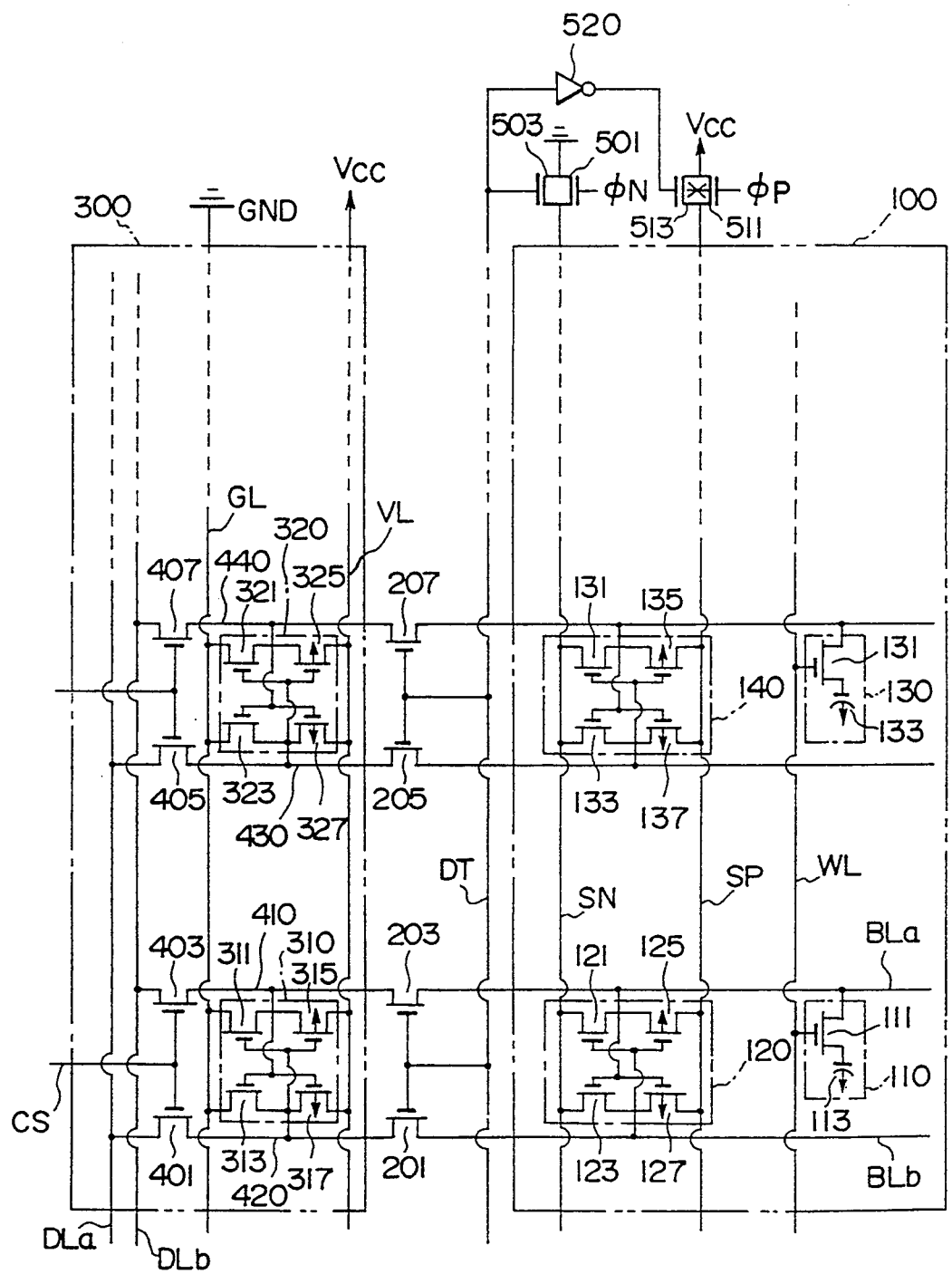
FIG. 1 is a circuit diagram of a serial access memory according to an embodiment of the present invention.

An embodiment of the present invention will be described with reference to FIG. 1 which is a circuit diagram of a serial access memory according to the embodiment of the present invention. FIG. 1 shows a part of the serial access memory. For example, two sense amplifiers 120 and 140 are illustrated in FIG. 1. However, the serial access memory of the embodiment has another sense amplifiers each of which has same circuit configuration of the sense amplifier 120. As simplification of the explanation and illustration, the repeated circuits are not illustrated in FIG. 1 nor explained in the specification.

The serial access memory has an register part 100 which has a plurality of DRAM cells 110, 130 and a SAM part 300 connected to the RAM part 100 through a plurality of data transfer gate transistors 201, 203, 205 and 207. 25 The RAM part 100 has a plurality of word lines WL and a plurality of bit line pairs BLa and Blb. Single transistor type memory cells 110 are respectively connected to the intersections of word lines WL and bit lines BLa or BLb in a matrix pattern. Each memory cell 110 comprises an NMOS transistor 111 for transferring the charge which is gate-controlled by the word line WL and a capacitor 113 for accumulating the charge. A sense amplifier 120 which detects and amplifies a potential difference on the bit line pairs BLa and BLb is connected to the bit line pairs BLa and BLb. The construction and arrangement of the memory cell 130 and the sense amplifier 140 are the same as described above and therefore the description of these items is omitted.

The sense amplifier 120 is driven with a sense amplifier drive signal. A sense amplification capability of the sense amplifier depends on the sense amplifier drive signal. The sense amplifier 120 comprises NMOS transistors 121 and 123 and PMOS transistors 125 and 127 which are cross-connected as shown in FIG. 1. That is, the gates of the transistors 121 and 125 and drains of the transistors 123 and 127 are commonly connected to the bit line BLb. The gates of the transistors 123 and 127 and drains of the transistors 121 and 125 are commonly connected to the bit line BLa. The sources of the PMOS transistors 125 and 127 are commonly connected to a drive line SP. The sources of the NMOS transistors 121 and 123 are commonly connected to a drive line SN.

The sense drive signal which appears on drive lines SN and SP is supplied through a first and a second sense drive NMOS transistors 501 and 503 and a first and a second sense drive PMOS transistors 511 and 513. The source of the first sense drive NMOS transistors 501 is connected to the ground GND and gate-controlled according to a first sense control signal ΦN. The source of the first sense drive PMOS transistor 511 is connected to a power supply VCC and gate-controlled according to a second sense control signal ΦP.

The second sense drive NMOS transistor 503 and the second sense drive PMOS transistor 513 are connected in parallel to the first sense drive NMOS transistor 501 and the first sense drive PMOS transistor 511 respectively. The second sense drive transistors 503 and 513 are gate-controlled with a data transfer control signal. The data transfer control signal appears on a control line DT. The control line DT is connected to the gates of transfer gate transistors 201, 203, 205 and 207, to the second sense drive NMOS transistor 503 and to the gate of the second sense drive PMOS transistor 513 through an inverter 520. The first sense drive NMOS transistor 501 and the first Sense drive PMOS transistor 511 have a small gate width and therefore their drive capability is small. On the other hand, the second sense drive NMOS transistor 503 and the second sense drive PMOS transistor 513 have a large gate width and therefore their drive capability is large.

The register part 300 includes a latch circuit 310 connected to the data transfer gate transistors 201 and 203 and a plurality of selection gate transistors 401 and 403 for transferring data between the latch circuit 310 and a pair of complementary data lines DLa and DLb.

The latch circuit 310 is connected between a power supply line VL connected to the power supply VCC and a ground line GL connected to the ground GND. The latch circuit 310 has two NMOS transistors 311 and 313 and two PMOS transistors 315 and 317. The gates of the transistors 313 and 317 and drains of the transistors 311 and 315 are commonly connected to a node 410. The gates of the transistors 311 and 315 and drains of the transistors 313 and 317 are commonly connected to a node 420. The sources of the PMOS transistors 125 and 127 are commonly connected to the power supply line VL. The sources of the NMOS transistors 311 and 313 are commonly connected to the ground line GL.

The selection gate transistors 401 and 403 are respectively connected between the nodes 420 and 410 of the latch circuit 310 and the data lines DLa and DLb. The gates of the selection gate transistors 401 and 403 are connected to the selection signal line.

The operation of the serial access memory according to the embodiment of the present invention will be described with reference to FIGS. 1 and 2.

FIG. 2 shows signals appeared on the nodes and lines illustrated in FIG. 1 for the explanation of the serial memory of the embodiment.

When reading the data stored in the memory cell 110 (a timing t1 shown in FIG. 2), a signal on the word line WL turns from a low level (hereinafter "L" level) to a high level (hereinafter "H" level) by a decoder not shown in FIG. 1. Therefore the NMOS transistor 111 of the memory cell 110 is turned on and the stored electrical charge of the capacitor 111 is output to the bit line BLa. The output of the stored electrical charge causes a slight difference of potentials on the bit line pairs BLa and BLb.

Subsequently, when the sense control signal ΦN turns from the "L" level to the "H" level and the signal ΦP turns from the "H" level to the "L" level (at time t2 shown in FIG. 2), the first sense drive NMOS transistor 501 and the first sense drive PMOS transistor 511 turn on. In response to turning on of the transistors 501 and 511, the sense drive signals on the drive lines SN and SP are brought to the "L" level and the "H" level respectively and the sense amplifier 120 begins to operate. Then the sense amplifier 120 amplifies a slight potential difference which has appeared on the bit line pairs BLa and BLb. Therefore, the pair of bit lines BLa and BLb have the "H" level and the "L" level respectively. At this time, the sense amplification capability of the sense amplifier 120 is relatively small because the sense drive signals are supplied from the power sources (the power supply VCC and the ground GND) through the transistors 501 and 511 which have small drive capability.

At a time t3, the data transfer control signal on the control line DT turns from the "L" level to the "H" level. The data transfer gate transistors 201 and 203, the second sense drive NMOS transistor 503 and the second sense drive PMOS transistor 513 turn on in response to the "H" level data transfer control signal. Accordingly, the sense amplification capability of the sense amplifier 120 becomes relatively large in response to the turning on of the transistors 503 and 513, each of which has large drive capability. The data (readout data) on the bit line pairs BLa and BLb are transferred to the nodes 410 and 420 of the latch circuit 310 of the register part 300 through the data transfer gate transistors 201 and 203 and are latched by the latch circuit 310. By this time, noises may have appeared on the power supply line VL and the ground line GL. However, the noises do not affect the latch circuit 310 because of the improved capability of the sense amplifier 120.

Subsequently, even when the Signal on the control line DT turns from the "H" level to the "L" level (at a timing t4) and the data transfer gate transistors 201 and 203 turn off, the readout data are held in the latch circuit 310.

When a selection signal CS selected by the decoder (shown) turns from the "L" level to the "H" level (at time t5), the selection gate transistors 401 and 403 turn on. Then, data held in the latch circuit 310 is output to the data line pairs DLa and DLb through the selection gate transistors 401 and 403.

The serial access memory according to this embodiment has the advantages described below:

(i) Since the gate width of the first sense drive NMOS transistor 501 and the first sense drive PMOS transistor 511 is small, the drive capability of them are also small. Therefore, the noises of the power supply potential and the ground potential when the sense amplifier operates is reduced.

(ii) During data transfer according to the data transfer control signal on the control line DT, the second sense drive NMOS transistor 503 and the second sense PMOS drive transistor 513 turn on. The sense amplifier 120 is supplied with the power supply potential and the ground potential through the switches having large drive capability. The switches include parallel connected NMOS transistor pair 501 and 503 and PMOS transistor pair 511 and 513. Accordingly, the sense amplifier 120 has a large drive capability and the output potential difference of the sense amplifier 120 becomes large. Therefore, the data transfer is certainly carried out without being affected by the data of the latch circuit 310.

(iii) The drive capacity of the latch circuit 310 of the register part 300 can be increased. With this increase of the drive capacity, the output speed to the data line pairs DLa and DLb can be speeded up.

(iv) The gates of the second sense drive NMOS transistor 503 and the second sense drive PMOS transistor 513 are controlled with the data transfer control signal. Therefore, an additional timing signal is not required and the control of the transistors 503 and 513 is ensured.

In the above embodiment, the drive capacity varying means is formed by the second sense drive transistors 511 and 513. On the contrary, the first sense drive NMOS transistor 501 and the first sense drive PMOS transistor 511 are given the large drive capacity. When the data are read out from the memory cell 110, the gates of these transistors 501 and 511 are controlled with sense control signals having small electric potential. When data are transferred from RAM part 100 to the register part 300, the sense control signals have large electric potential and the drive capacity of transistors 501 and 511 is increased. This configuration can provide an almost similar advantages to the embodiment of the present invention.

The memory cell 110 or the sense amplifier 120 of the RAM part 100 shown in FIG. 1 can be made in other circuit configurations. In addition, the latch circuit 310 of the register part 300 can be made in other circuit configurations.

What is claimed is:

1. A memory circuit comprising:
   a pair of bit lines;
   a data memory circuit having a plurality of memory cells each of which is coupled to a respective one of said bit lines;
   a sense amplifier drive line coupled to a potential source for supplying a sense amplifier drive signal from the potential source;
   a sense amplifier coupled to said pair of bit lines and said sense amplifier drive line for amplifying a difference of electrical potentials on said pair of bit lines in response to the sense amplifier drive signal, said sense amplifier having a sense amplification capability;
   a pair of data lines;
   a data latch circuit coupled to said pair of bit lines and said pair of data lines for latching the electrical potentials amplified by said sense amplifier as data, said data latch circuit having a latching capability;
   a data transfer circuit coupled between said pair of bit lines and said data latch circuit for controlling an electrical connection between said bit lines and said data latch circuit in response to a data transfer control signal; and
   a drive capability control circuit coupled between the potential source and said sense amplifier drive line for controlling an electrical connection between the potential source and sense amplifier drive line so that said drive capability control circuit changes the sense amplification capability of said sense amplifier in response to the data transfer control signal to be larger than the latching capability when said data transfer circuit electrically couples said bit lines and said data latch circuit, said drive capability control circuit including a first transistor coupled between the potential source and said sense amplifier drive line, the first transistor being controlled by the data transfer control signal, and a second transistor coupled in parallel to the first transistor.

2. A memory circuit according to claim 1, further comprising a selection gate circuit coupled between said data latch circuit and said data lines for controlling an electrical connection between the data latch circuit and data lines.

3. A memory circuit according to claim 1, wherein the first transistor has a larger drive capability than a drive capability of the second transistor.

4. The memory circuit of claim 3 wherein said second transistor is coupled to receive and be controlled by a further control signal distinct from the data transfer control signal.

5. A memory circuit having a pair of bit lines for reading data from a plurality of memory cells and a pair of data lines for outputting the read data therefrom, the memory circuit comprising:
   a sense amplifier coupled to the bit lines for amplifying a difference of electrical potentials on the bit lines, said sense amplifier receiving a sense amplifier drive signal having a first drive capability;
   a data latch circuit coupled to the bit lines and the data lines for latching the electrical potentials amplified by said sense amplifier as data, said data latch circuit receiving a latch drive signal having a second drive capability;
   a data transfer circuit coupled between the bit lines and said data latch circuit for controlling an electrical connection between said bit lines and said data latch circuit in response to a data transfer control signal; and
   a drive circuit coupled to said sense amplifier for generating the sense amplifier drive signal, said drive circuit setting the first drive capability larger than the second drive capability when the bit lines are coupled to said data latch circuit in response to the data transfer control signal, said drive circuit including a potential source and a first transistor coupled between the potential source and said sense amplifier for controlling an electrical connection between the potential source and said sense amplifier in response to the data transfer control signal controlling the first transistor.

6. A memory circuit according to claim 5, further comprising a selection gate circuit coupled between said data latch circuit and said data lines for controlling an electrical connection between the data latch circuit and data lines.

7. A memory circuit according to claim 6, wherein said drive circuit further includes a second transistor coupled in parallel to the first transistor.

8. A memory circuit according to claim 7, wherein the first transistor has a larger drive capability than a drive capability of the second transistor.

9. The memory circuit of claim 8 wherein said second transistor is coupled to receive and be controlled by a further control signal distinct from the data transfer control signal.

10. A memory circuit having a pair of bit lines for reading data from a plurality of memory cells and a pair of data lines for outputting the read data therefrom, the memory circuit comprising:
    a sense amplifier coupled to the bit lines for amplifying a difference of electrical potentials on the bit lines during a first and a second time periods, said sense amplifier receiving a sense amplifier drive signal;
    a data latch circuit coupled to the bit lines and the data lines for latching the electrical potentials amplified by said sense amplifier as data, said data latch circuit receiving a latch drive signal having a first drive capability;
    a data transfer circuit coupled between the bit lines and said data latch circuit for electrically connecting said bit lines and said data latch circuit in response to a data transfer control signal during the second time period; and
    a drive circuit coupled to said sense amplifier for generating the sense amplifier drive signal having a second drive capability during the first time period and a third drive capability that is larger than the first drive capability during the second time period so that a sense amplification capability of said sense amplifier is larger than a latch capability of said data latch circuit during the second time period; said drive circuit including a potential source and a first transistor coupled between the potential source and said sense amplifier for electrically connecting between the potential source and said sense amplifier during the second time period in response to the data transfer control signal controlling the first transistor.

11. A memory circuit according to claim 10, further comprising a selection gate circuit coupled between said data latch circuit and the data lines for electrically connecting between the data latch circuit and data lines during a third time period.

12. A memory circuit according to claim 10, wherein said drive circuit further includes a second transistor coupled in parallel to the first transistor for electrically connecting between the potential source and said sense amplifier during the first time period.

13. A memory circuit according to claim 12, wherein the first transistor has a larger drive capability than a drive capability of the second transistor.

14. The memory circuit of claim 13 wherein said second transistor is coupled to receive and be controlled by a further control signal distinct from the data transfer control signal.

15. A memory circuit according to claim 10, wherein the second drive capability is equal to or smaller than the third drive capability.

* * * * *